(12) United States Patent
Chen et al.

(10) Patent No.: US 8,139,436 B2
(45) Date of Patent: Mar. 20, 2012

(54) INTEGRATED CIRCUITS, SYSTEMS, AND METHODS FOR REDUCING LEAKAGE CURRENTS IN A RETENTION MODE

(75) Inventors: Yen-Huei Chen, Hsinchu (TW); Cheng Hung Lee, Hsinchu (TW)

(73) Assignee: Taiwan Semiconductor Manufacturing Company, Ltd.

( * ) Notice: Subject to any disclaimer, the term of this patent is extended or adjusted under 35 U.S.C. 154(b) by 196 days.

(21) Appl. No.: 12/716,363

(22) Filed: Mar. 3, 2010

(65) Prior Publication Data

US 2010/0238753 A1     Sep. 23, 2010

Related U.S. Application Data

(60) Provisional application No. 61/160,951, filed on Mar. 17, 2009.

(51) Int. Cl.
*G11C 5/14*      (2006.01)

(52) U.S. Cl. .................................. 365/229; 365/189.09

(58) Field of Classification Search .................. 365/229, 365/189.09
See application file for complete search history.

(56) References Cited

U.S. PATENT DOCUMENTS

| | | | | |
|---|---|---|---|---|
| 5,608,670 A | * | 3/1997 | Akaogi et al. | 365/185.23 |
| RE37,593 E | * | 3/2002 | Etoh et al. | 365/189.09 |
| 6,717,460 B2 | * | 4/2004 | Yamauchi et al. | 327/544 |
| 7,286,391 B2 | * | 10/2007 | Nii | 365/156 |
| 2002/0191472 A1 | * | 12/2002 | Okamoto et al. | 365/227 |
| 2010/0254209 A1 | * | 10/2010 | Lee et al. | 365/226 |

* cited by examiner

*Primary Examiner* — Tuan T. Nguyen

(74) *Attorney, Agent, or Firm* — Lowe Hauptman Ham & Berner, LLP

(57) ABSTRACT

An integrated circuit includes at least one memory array for storing data. A first switch is coupled with the memory array. A first power line is coupled with the first switch. The first power line is operable to supply a first power voltage. A second switch is coupled with the memory array. A second power line is coupled with the second switch. The second power line is operable to supply a second power voltage for retaining the data during a retention mode. A third power line is coupled with the memory array. The third power line is capable of providing a third power voltage.

20 Claims, 4 Drawing Sheets

INTEGRATED CIRCUITS, SYSTEMS, AND METHODS FOR REDUCING LEAKAGE CURRENTS IN A RETENTION MODE

CROSS-REFERENCE TO RELATED APPLICATIONS

The present application claims priority of U.S. Application Ser. No. 61/160,951, filed on Mar. 17, 2009, which is incorporated herein by reference in its entirety.

TECHNICAL FIELD

The present disclosure relates generally to the field of semiconductor circuits, and more particularly, to integrated circuits, systems, and methods for reducing leakage currents during operation in a retention mode.

BACKGROUND

Recently, system-on-chip (SoC) technology has provided reduced development cycle time while increasing product functionality, performance, and quality. SoC technology allows placement of multiple function "subsystems" on a single semiconductor chip. The various types of subsystems that may be integrated within the semiconductor chip include microprocessor and micro-controller cores, digital signal processors (DSPs), memory blocks, communication cores, sound and video cores, radio frequency (RF) cells, power management, and high-speed interfaces, among others. SoC technology can thus provide customized products for a variety of applications, including low-power, wireless, networking, consumer and high-speed applications.

SUMMARY OF THE INVENTION

In one embodiment, an integrated circuit includes at least one memory array for storing data. A first switch is coupled with the memory array. A first power line is coupled with the first switch. The first power line is operable to supply a first power voltage. A second switch is coupled with the memory array. A second power line is coupled with the second switch. The second power line is operable to supply a second power voltage for retaining the data during a retention mode. A third power line is coupled with the memory array. The third power line is operable to supply a third power voltage.

In another embodiment, a system includes a processor coupled with an integrated circuit. The integrated circuit includes at least one memory array for storing data. A first switch is coupled with the memory array. A first power line is coupled with the first switch. The first power line is operable to supply a first power voltage. A second switch is coupled with the memory array. A second power line is coupled with the second switch. The second power line is operable to supply a second power voltage for retaining the data during a retention mode. A third power line is coupled with the memory array. The third power line is operable to supply a third power voltage.

In another embodiment, a method for reducing a leakage current of a memory array during operation in a retention mode is provided. The method includes coupling the memory array with a first power line supplying a first power voltage, if the memory array operates in an active mode. The memory array is coupled with a second power line providing a second power voltage, if the memory array operates in a retention mode.

These and other embodiments of the present invention, as well as its features are described in more detail in conjunction with the text below and attached figures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE INVENTION

Figure 1:
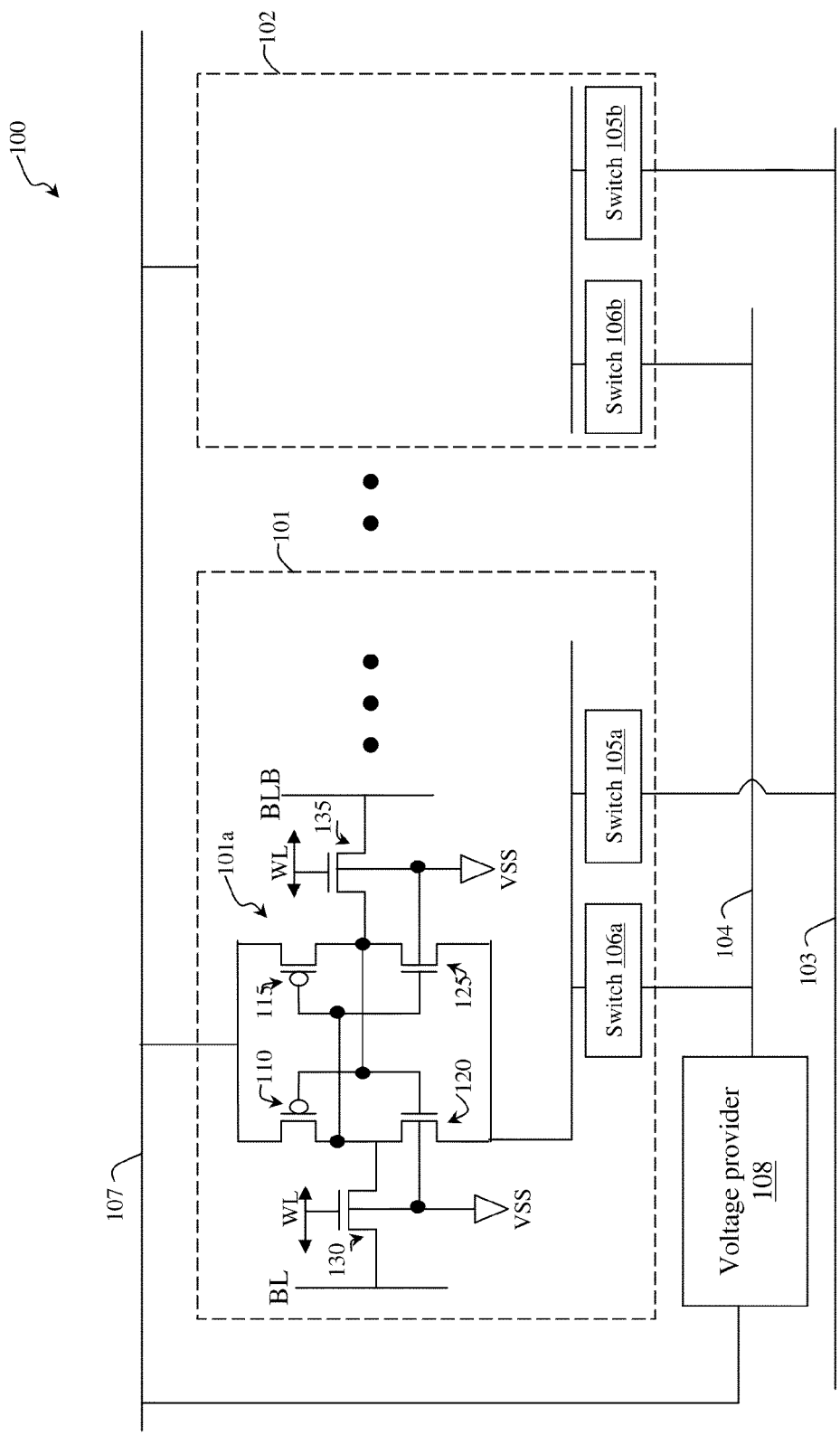
FIG. 1 is a schematic drawing illustrating an exemplary system on chip (SoC) including at least one memory array.

Conventionally, a SoC can include more than two memory arrays having different memory sizes. The SoC can include clamping circuits, each of the clamping circuits being coupled between a corresponding memory array and a power source $V_{DD}$. Conventionally, the clamping circuits are passive circuits and each clamping circuit consists of several series-connected diodes. During the operation of the SoC, one memory array operates in an active mode and the other memory arrays operate in a retention mode. For the memory array being activated, a PMOS transistor coupled between the activated memory array and the power source $V_{DD}$ is turned on. The turned-on PMOS transistor couples the memory array with the power source $V_{DD}$. The non-activated memory arrays tend to retain their data. To retain the data, PMOS transistors coupled between the non-activated memory arrays and the power source $V_{DD}$ are turned off. The power source $V_{DD}$ is coupled to the non-activated memory arrays by a voltage drop provided by the clamping circuits. The reduced voltage to the non-activated arrays can help to retain the data stored therein. Since the non-activated memory arrays see the reduced voltage, which is lower than the power source $V_{DD}$, the leakage currents flowing through the non-activated memory arrays are less than the current flowing through the activated memory array.

As noted, the clamping circuit consists of several series-connected diodes. It is also noted that the memory arrays have different memory sizes. It is found that retaining data of the memory arrays with different macro sizes may use the clamping circuits having different numbers of series diodes. Using the clamping circuits having the same number of series diodes may increase the leakage currents of some memory arrays.

It is also found that the diodes of the clamping circuits are subjected to Process-Voltage-Temperature (PVT) variations. At the worst corner of the PVT variations, efficiencies of the diodes may degrade and cannot reach the desired voltage drop applied between the power $V_{DD}$ and the non-activated memory arrays during the retention mode. The PVT variations may result in data retention failures and/or increases of leakage currents during operation in retention mode.

Furthermore, a dynamic voltage frequency scaling (DVFS) technique may be applied to the memory arrays for widening operating voltages ranging from, for example, 0.7 V to 1.3 V corresponding to the change of the operating frequency. It is found that the diodes of the clamping circuits do not change their diode voltages corresponding to the change of the operating frequency. The DVFS technique makes the use of the clamping circuits to retain data and/or reduce leakage currents in the memory arrays less desirable.

Based on the foregoing, integrated circuits, systems, and methods for retaining data and/or reducing leakage currents of memory arrays during operation in retention mode are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the disclosure that follows may include embodiments in which the features are formed in direct contact. Formation of features may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing illustrating an exemplary system on chip (SoC) including at least one memory array. In FIG. 1, an integrated circuit 100, e.g., an SoC, can include at least one memory array, e.g., memory arrays 101 and 102. Each of the memory arrays 101 and 102 can include a plurality of word lines WLs and a plurality of bit lines BLs and BLBs. Each of the memory arrays 101 and 102 can include a static random access memory (SRAM) array, an embedded SRAM array, a dynamic random access memory (DRAM) array, an embedded DRAM array, a non-volatile memory array, e.g., FLASH, EPROM, E²PROME, a field-programmable gate array, a logic circuit array, and/or other memory array. In embodiments, the memory arrays 101 and 102 have different memory sizes or macro sizes.

The integrated circuit 100 can include switches 105a and 105b coupled with the memory arrays 101 and 102, respectively. A power line 103 can be coupled with the switches 105a and 105b. In embodiments using a footer, the power line 103 is operable to supply a power voltage, e.g., $V_{SS}$ or ground. The integrated circuit 100 can include switches 106a and 106b being coupled with the memory arrays 101 and 102, respectively. A power line 104 can be coupled with the switches 106a and 106b. The power line 104 is capable of providing a power voltage for retaining the data stored in the memory arrays 101 and 102 during operation in a retention mode. In embodiments, the power voltage supplied by power line 104 can be higher than the power voltage supplied by power line 103. In embodiments using a footer, the power voltage of the power line 104 can be referred to as a virtual ground or retention ground. A power line 107 can be coupled with the memory arrays 101 and 102. In embodiments using a footer, the power line 107 is capable of providing a voltage, e.g., $V_{DD}$, to the memory arrays 101 and 102.

The switches 105a-105b and 106a-106b are configured to couple the power lines 103 and 104 with the memory arrays 101 and 102, respectively. In embodiments activating the memory array 101, the switch 105a is turned on and switch 106a is turned off. The turned-on switch 105a can couple the memory array 101 with the power line 103. In embodiments retaining the data stored in the memory array 101, the switch 106a is turned on and the switch 105a is turned off. The turned-on switch 106a can couple the memory array 101 with the power line 104. The operation of the switches 105b and 106b of the memory array 102 is similar with that of the switches 105a and 106a of the memory array 101. Each of the switches 105a-105b and 106a-106b can include a NMOS transistor, a PMOS transistor, a dual-gate transistor, a diode, other switch that is capable of coupling the power line with the memory array, and/or combinations thereof.

In embodiments, the integrated circuit 100 can include a voltage provider 108. The voltage provider 108 can be coupled between the power lines 104 and 107. The voltage provider 108 can supply the power line 104 the power voltage for retaining the data of the memory arrays 101 and 102 during the retention mode. The voltage provider 108 is capable of tracking a change of the power voltage of the power line 107 due to, for example, an operating frequency of the memory arrays 101 and/or 102. The voltage provider 108 can supply a power voltage of the power line 104 corresponding to the change of the power voltage supplied by power line 107. For example, if the power voltage of the power line 107 increases by 0.1 V, the power voltage of the power line 104 can be raised by about 0.1 V. By tracking the power voltage of the power line 107, the voltage provider 108 can provide the power voltage of the power line 104 for desirably retaining the data stored in the memory arrays 101 and 102 during operation in the retention mode.

Referring to FIG. 1, for embodiments using a 6-T SRAM memory cell, the memory array 101 can include a plurality of word lines WLs and a plurality of bit lines BLs and BLBs. The memory array 101 can include at least one memory cell 101a. The memory cell 101a can be coupled with a bit line BL, a bit line bar BLB, a word line WL, the power line 107 having a voltage, e.g., $V_{DD}$, and the switches 105a and 106a. It is noted that though only one memory cell 101a is depicted, other memory cells (not shown) can be coupled with the plurality of word lines WLs and bit lines BLs of the memory array. A portion of the memory array may have 8, 16, 32, 64, 128 or more columns that can be arranged in word widths. In embodiments, the word lines can be laid out substantially orthogonally to the bit lines. In other embodiments, other arrangements of the word lines and bit lines can be provided.

Referring again to FIG. 1, the memory cell 101a can include transistors 110, 115, 120, 125, 130, and 135. In embodiments, the transistors 110, 120 and 115, 125 can be functionable as two cross-latch inverters forming a flip-flop for storing the datum of the memory cell 101a. The transistors 130 and 135 can be operable as two pass transistors, access transistors, or pass gates. In embodiments, the transistors 110 and 115 can be referred to as pull-up transistors and the transistors 120 and 125 can be referred to as pull-down transistors. The pull-up transistors can be configured to pull a potential towards the power source of the power line 107. The pull-down transistors can be configured to pull a potential towards the power source of either the power line 103 or the power line 104.

In embodiments, the source ends of the transistors 110 and 115 can be electrically coupled with the power line 107. A drain of the transistor 110 can be electrically coupled with a source of the transistor 130, a drain of the transistor 120, and a gate of the transistor 115. A drain of the transistor 115 can be electrically coupled with a source of the transistor 135, a drain of the transistor 125, and a gate of the transistor 110. The sources of the transistors 120 and 125 can be electrically coupled with the switches 105a and 106a. The switches 105a and 106a can be selectively turned on, coupling the source of the transistors 120 and 125 with the power lines 103 and 104, respectively. The gate of the transistor 110 can be coupled with the gate of the transistor 120. The gate of the transistor 115 can be coupled with the gate of the transistor 125.

Drains of the transistors 130 and 135 can be electrically coupled with the bit line BL and bit line bar BLB, respectively. The gates of the transistors 130 and 135 can be electrically coupled with the word line WL. The bit lines BL, BLB and the word line WL may extend to other memory cells of the memory array. It is noted that the number, type, and disposition of the transistors 110, 115, 120, 125, 130, and 135 are mere examples. One of skill in the art is able to modify the number, type, and disposition of the transistors to achieve a desired memory array.

Following is an exemplary description regarding activating the memory array 101 and retaining the data stored in the memory array 101. During the active mode, the switch 105a is turned on and the switch 106a is turned off. The turned-on switch 105a can couple the sources of the transistors 120 and 125 with the power line 103 supplying the power voltage, e.g., $V_{SS}$ or ground. The power lines 103 and 107 can supply a desired voltage difference for the operation of the memory cell 101a. Since the switch 106a is turned off, the memory cell 101a can be desirably electrically insulated from the power line 104.

During operation in the retention mode, the switch 106a is turned on and the switch 105a is turned off. The turned-off switch 105a can desirably electrically insulate the memory cell 101a from the power line 103. The turned-on switch 106a can couple the sources of the transistors 120 and 125 with the power line 104 having the power voltage, e.g., virtual ground or retention ground. In embodiments using a footer, the power voltage of the power line 104 can be higher than that of the power line 103. In other embodiments, a voltage difference between the power lines 107 and 104 can be between about 0.5 V and about 0.6 V for data retention. For example, the power line 107 can have a power voltage of about 0.9 V. The voltage of the power line 104 can be between about 0.3 V and about 0.4 V. During retention, the switch 106a can couple the sources of the transistors 120 and 125 with the power line 104, pulling up the voltage of the sources of the transistors 120 and 125.

It is found that during the data retention the positive-voltage sources of the transistors 120 and/or 125 can desirably reduce leakage currents flowing from the drains of the transistors 110 and/or 115 through the transistors 110, 120, and/or 115, 125, respectively. The positive-voltage sources of the transistors 120 and/or 125 may also reduce leakage currents flowing from the bit line BL and/or bit line bar BLB through the transistors 130 and/or 135, respectively. The voltage difference between the power lines 104 and 107 between about 0.5 V and about 0.6 V can desirably retain the data of the memory cell 101a. During the data retention the positive-voltage sources of the transistors 120 and 125 can reduce the leakage currents as described above. Even if the integrated circuit 100 operates at worst corners of Process-Voltage-Temperature (PVT) variations, the switch 106a and the voltage provider 108 can provide a desired voltage difference between the power lines 104 and 107 for the data retention and/or the reduction of leakage currents. Furthermore, the use of the switches 105a, 106a, the power lines 103, 104, and the voltage provider 108 can be applied to memory arrays 101 and 102 that have different memory sizes or macro sizes.

Figure 2:
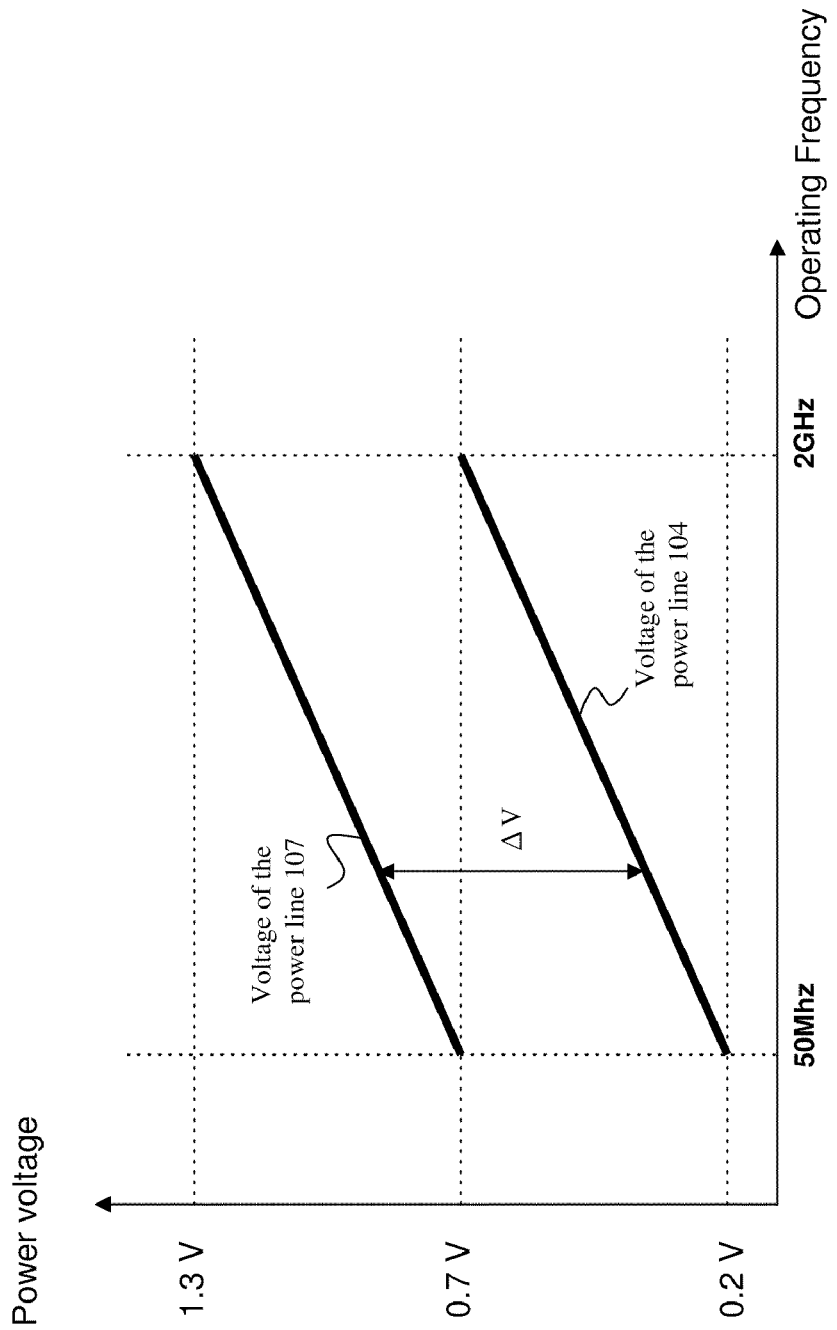
FIG. 2 is a schematic drawing showing a relationship between the power voltages of different power lines.

As noted, the Dynamic Voltage Frequency Scaling (DVFS) technique can be applied to the memory arrays. The operating voltages of the memory array 101 can range from about 0.7 V and about 1.3 V. It is noted that the voltage provider 108 is capable of tracking the power voltage of the power line 107, providing the power line 104 the power voltage, e.g., virtual ground or retention ground. Even if the power voltage of the power line 107 may vary corresponding to the change of the operating frequency of the memory array 101. The voltage provider 108 can provide the voltage of the power line 104 corresponding to the change of the power voltage of the power line 107 as shown in FIG. 2. FIG. 2 is a schematic drawing showing a relationship between the power voltages of the power lines 104 and 107. In FIG. 2, the horizontal axis represents the operating frequency of the memory arrays. The vertical axis represents the power voltage applied to the memory arrays. The voltage power of the power line 107 may gradually increase corresponding to the increase of the operating frequency of the memory array 101. The voltage provider 108 can supply the power line 104 the power voltage that increases corresponding to the raise of the voltage of the power line 107. By tracking the power voltage of the power line 107, the voltage difference ΔV between the power lines 104 and 107 can desirably retain the data stored in the memory array 101 during the retention mode. From the foregoing, if the DVFS technique is applied, the integrated circuit 100 can still desirably retain data of the memory array 101 and/or reduce the leakage currents during operation in the data retention mode.

It is noted that the number and/or type of the switches and transistors described above in conjunction with FIG. 1 are merely exemplary. The dispositions of the power lines, the switches, and the voltage provider are configured for a footer. The power lines, the switches, and the voltage provider can be disposed for a header. For embodiments using a header, a power line having a power voltage, e.g., $V_{DD}$, can be coupled with the memory array through a switch. Another power line having a power voltage, e.g., virtual $V_{DD}$, can be coupled with the memory array through another switch. The other power line having a power voltage, e.g., VSS or ground, is coupled with the memory array. From the description in conjunction with the FIG. 1, one of skill in the art is able to dispose the power lines, switches, and voltage provider for the header.

Figure 3:
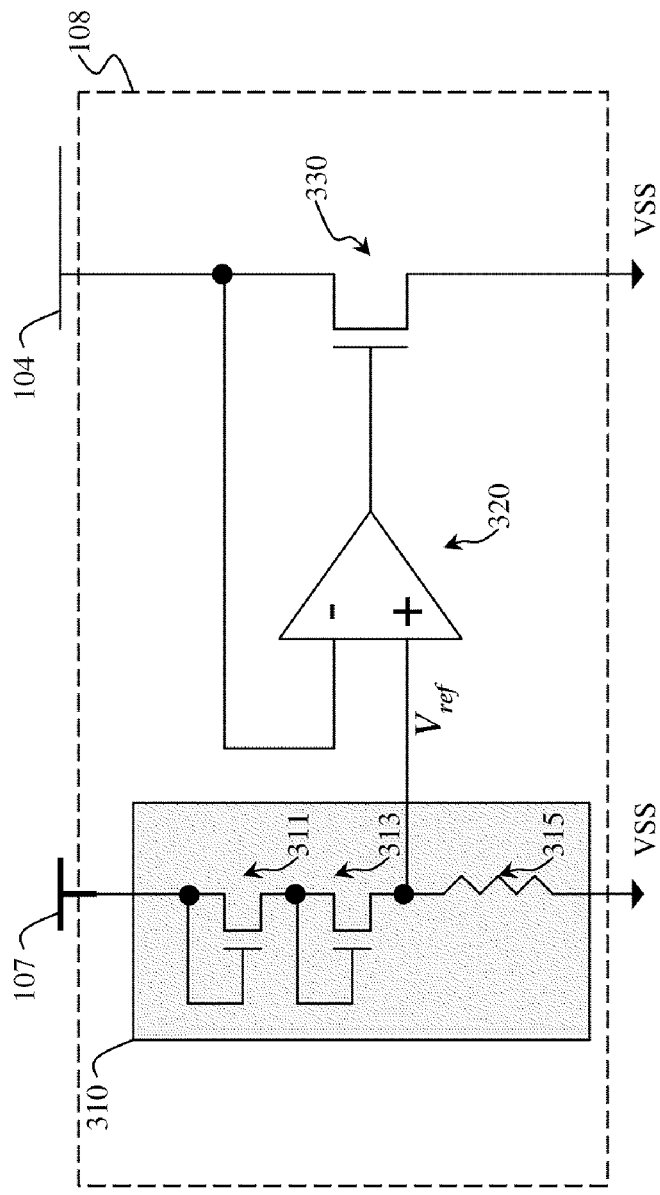
FIG. 3 is a schematic drawing showing an exemplary voltage provider.

FIG. 3 is a schematic drawing showing an exemplary voltage provider. In FIG. 3, a voltage provider 108 can include a reference voltage generator 310, an amplifier 320, and a transistor 330. The reference voltage generator 310 can have a first output end for outputting a reference voltage ($V_{ref}$). The amplifier 320 can have a first input end, a second input end, and an output end. The first input end of the amplifier 320 can be coupled with the output end of the reference voltage generator 310. The transistor 330 can be coupled with the output end of the amplifier 320. A drain of the transistor 330 can be coupled with the second input end of the amplifier 320 and the power line 104.

In embodiments, the reference voltage generator 310 can be coupled with the power line 107. The reference voltage generator 310 can include at least one transistor, e.g., transistors 311 and 313 coupled in series. The transistors 311 and 313 can be coupled with at least one resistor, e.g., resistor 315. The output end of the reference voltage generator 310 can be disposed between the resistor 315 and the transistors 311, 313. As noted, the voltage provider 108 can track the power voltage of the power line 107, supplying the voltage reference between the power lines 104 and 107 between about 0.5 V and about 0.6 V. The voltage drop on the transistors 311 and 313 can be substantially equal to the voltage difference between the power lines 104 and 107. For example, the power line 107 has the power voltage, e.g., $V_{DD}$. A threshold voltage of each of the transistors 311 and 313 can be around 0.25 V. The reference voltage $V_{ref}$ at the output end can be about $V_{DD}$ −0.5 V. It is also noted that the number and type of the transistors and/or resistor of the reference voltage generator 210 are merely exemplary. One of skill in the art is able to modify them to achieve a desired reference voltage generator.

The amplifier 220 and the transistor 230 are configured to modulate and/or maintain the voltage of the power line 104 being substantially equal to the reference voltage $V_{ref}$ at the first input end of the amplifier 220. It is noted that the reference voltage generator 210 described above is merely exemplary. Different reference voltage generators, e.g., a bandgap reference voltage generator or other suitable reference voltage generator, can be applied. It is also noted that the number and type of the transistors and/or amplifier of the voltage provider 108 are merely exemplary. One of skill in the art is able to modify them to achieve a desired voltage provider.

Figure 4:
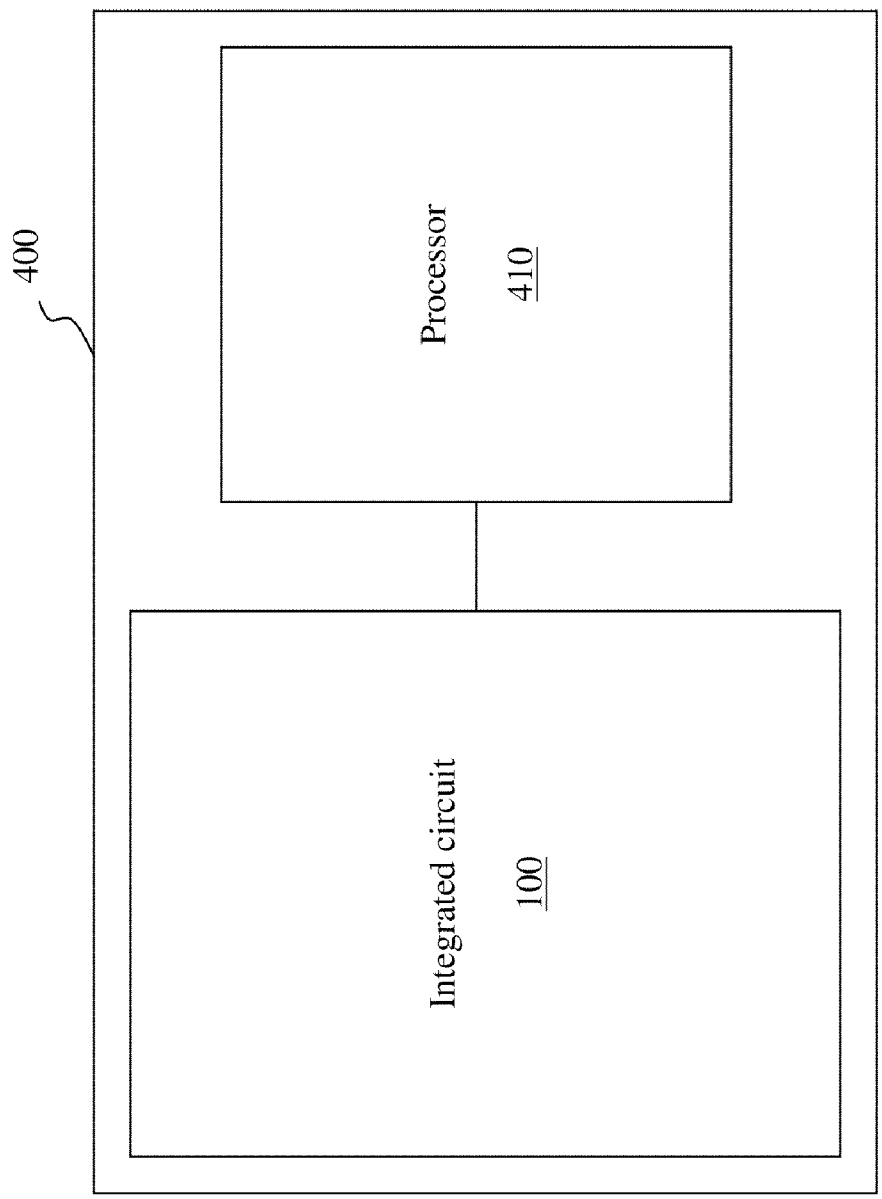
FIG. 4 is a schematic drawing showing a system including an exemplary memory circuit.

FIG. 4 is a schematic drawing showing a system including an exemplary memory circuit. In FIG. 4, a system 400 can include a processor 410 coupled with the memory circuit 100. The processor 410 is capable of accessing the datum stored in the memory cell 101 (shown in FIG. 1) of the memory circuit 100. In embodiments, the processor 410 can be a processing unit, central processing unit, digital signal processor, or other processor that is suitable for accessing data of memory circuit.

In embodiments, the processor 410 and the memory circuit 100 can be formed within a system that can be physically and electrically coupled with a printed wiring board or printed circuit board (PCB) to form an electronic assembly. The electronic assembly can be part of an electronic system such as a computer, a wireless communication device, a computer-related peripheral, an entertainment device, or the like.

In embodiments, the system 400 including the memory circuit 100 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   at least one memory array for storing data;
   a first switch coupled with the memory array;
   a first power line coupled with the first switch, the first power line being capable of providing a first power voltage;
   a second switch coupled with the memory array;
   a second power line coupled with the second switch, the second power line being capable of supplying a second power voltage for retaining the data during a retention mode; and
   a third power line coupled with the memory array, the third power line being capable of supplying a third power voltage.

2. The integrated circuit of claim 1 further comprising a voltage provider coupled between the second power line and the third power line, wherein the voltage provider is capable of tracking a change of the third power voltage and providing the second power voltage corresponding to the change of the third power voltage.

3. The integrated circuit of claim 2, wherein the voltage provider comprises:
   a reference voltage generator having a first output end, the reference voltage generator operable to supply a reference voltage;
   an amplifier coupled with the first output end of the reference voltage generator, the amplifier having a second output end; and
   a transistor coupled with the second output end of the amplifier, the transistor being coupled with the second power line, wherein the amplifier and the transistor are configured to modulate the second power voltage being substantially equal to the reference voltage.

4. The integrated circuit of claim 3, wherein the reference voltage generator comprises:
   at least one transistor being coupled with the third power line; and
   at least one resistor being coupled with the at least one transistor, wherein the output end of the reference voltage generator is between the at least one transistor and the at least one resistor.

5. The integrated circuit of claim 1, wherein a difference between the second power voltage and the third power voltage is between about 0.5 V and about 0.6 V.

6. The integrated circuit of claim 1, wherein the first power voltage is ground or $V_{SS}$ and the second power voltage is a virtual ground.

7. The integrated circuit of claim 1, wherein each of the first and second switches comprises at least one NMOS transistor.

8. A system comprising:
   a processor; and
   an integrated circuit coupled with the processor, the integrated circuit comprising:
      at least one memory array for storing data;
      a first switch coupled with the memory array;
      a first power line coupled with the first switch, the first power line operable to supply a first power voltage;
      a second switch coupled with the memory array;
      a second power line coupled with the second switch, the second power line operable to supply a second power voltage for retaining the data during a retention mode; and
      a third power line coupled with the memory array, the third power line operable to supply a third power voltage.

9. The system of claim 8, wherein the integrated circuit further comprises a voltage provider coupled between the second power line and the third power line and the voltage provider is operable to track a change of the third power voltage and supply the second power voltage corresponding to the change of the third power voltage.

10. The system of claim 9, wherein the voltage provider comprises:

a reference voltage generator having a first output end, the reference voltage generator operable to supply a reference voltage;

an amplifier coupled with the first output end of the reference voltage generator, the amplifier having a second output end; and a transistor coupled with the second output end of the amplifier, the transistor being coupled with the second power line, wherein the amplifier and the transistor are configured to modulate the second power voltage being substantially equal to the reference voltage.

11. The system of claim 10, wherein the reference voltage generator comprises:

at least one transistor being coupled with the third power line; and at least one resistor being coupled with the at least one transistor, wherein the output end of the reference voltage generator is between the at least one transistor and the at least one resistor.

12. The system of claim 8, wherein a difference between the second power voltage and the third power voltage is between about 0.5 V and about 0.6 V.

13. The system of claim 8, wherein the first power voltage is ground or VSS and the second power voltage is a virtual ground.

14. The system of claim 8, wherein each of the first and second switches comprises at least one NMOS transistor.

15. A method for reducing a leakage current of a memory array at a retention mode, the method comprising:

coupling the memory array with a first power line providing a first power voltage, if the memory array operates at an active mode; and coupling the memory array with a second power line providing a second power voltage, if the memory array operates at a retention mode.

16. The method of claim 15 further comprising:

coupling the memory array with a third power line being capable of providing a third power voltage; and tracking a change of the third power voltage to provide the second power voltage corresponding to the change of the third power voltage.

17. The method claim 15, wherein a difference between the second power voltage and the third power voltage is between about 0.5 V and about 0.6 V.

18. The method of claim 15, wherein the first power voltage is ground or $V_{SS}$ and the second power voltage is a virtual ground.

19. The method of claim 15, wherein coupling the memory array with the first power line comprises:

turning on a first switch to couple the memory array with the first power line.

20. The method of claim 15, wherein coupling the memory array with the second power line comprises:

turning on a second switch to couple the memory array with the second power line.

* * * * *